US006587998B2

(12) United States Patent
Rodeh

(10) Patent No.: US 6,587,998 B2
(45) Date of Patent: Jul. 1, 2003

(54) SEARCHING FOR COUNTER-EXAMPLES INTELLIGENTLY

(75) Inventor: Yoav Rodeh, Moshav Ben-Ami (IL)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 09/761,972

(22) Filed: Jan. 16, 2001

(65) Prior Publication Data

US 2002/0095645 A1 Jul. 18, 2002

(51) Int. Cl.$^7$ ............................................... G06F 17/50
(52) U.S. Cl. .................... 716/5; 716/4; 716/6
(58) Field of Search ............................ 716/1, 4–7, 18; 703/2, 14, 15; 717/120

(56) References Cited

U.S. PATENT DOCUMENTS 5,513,122 A * 4/1996 Cheng et al. .................. 716/5
6,185,516 B1 * 2/2001 Hardin et al. .................. 703/2

OTHER PUBLICATIONS

Ravi, K. et al., "High Density Reachability Analysis", IEEE International Conference on Computer Aided Design (1995), pp. 154–158, San Jose.
Ravi, K. et al., "Approximation and Decomposition of Binary Decision Diagrams", Proceedings of the 35$^{th}$ ACM/IEEE Design Automation Conference, 1998, San Francisco, pp. 445–450.
Clark, E. et al., Counterexample–guided Abstraction Refinement:, Proceedings of the Computer Aided Verification Conference, 2000, pp. 1–25.
Yuan, J. et al., "On Combining Formal and Informal Verification", Proceedings of the Computer Aided Verification Conference, 1997, pp. 1–12, Haifa, Israel.
Hu, A. et al., "Efficient Verification with BDDs Using Implicitly Conjoined Invariants", Lecture Notes in Computer Science 697, Springer–Verlag, 1993, pp. 1–12.

McMillan, K., *Symbolic Model Checking*, Chapter 2, "Model Checking", pp. 11–12, Kluwer Academic Press, 1993.
Clarke, E. Jr. et al., *Model Checking*, Chapter 1, p. 4 & p. 6, MIT Press, 1999.
Beer, I. et al., "RuleBase: an Industry–Oriented Formal Verification Tool", DAC Conference, 1996, Las Vegas, Nevada, pp. 1–6.
Ganai, M. et al., "Efficient Coverage Directed State Space Search", Proceedings of the International Workshop on Login Synthesis, Lake Tahoe, Ca., 1998, pp. 1–15.
Geist, D. et al., "Efficient Model Checking by Automated Ordering of Transition Relation Partitions", Proceedings of the Computer Aided Verification Conference, 1994, pp. 1–9, Berlin.
Yang, C. et al., "Validation with Guided Search of the State Space", 35$^{th}$ Design Automation Conference, 1998, San Francisco, CA., pp. 1–6.
Kantrowitz, M. et al., "I'm Done Simulating: Now What? Verification Coverage Analysis and Correctness Checking of the DECchip 21164 Alpha Microprocessor", 33$^{rd}$ Design Automation Conference, 1996, Las Vegas, NV., pp. 1–6.

* cited by examiner

*Primary Examiner*—Vuthe Siek
*Assistant Examiner*—Naum Levin
(74) *Attorney, Agent, or Firm*—Darby & Darby

(57) ABSTRACT

A method for finding a counterexample on a system of states, including one or more initial states and one or more bad states, and a transition relation among the states. The method includes assembling a first set of the states known to be reachable from the initial states in accordance with the transition relation, and defining a second set of the states from which it is estimated that one of the bad states is reachable in accordance with the transition relation. The sets of the states are modified until a definition of the second set is found such that from one or more of the states in an intersection of the first and second sets, there is at least one of the bad states that can be reached in a given number of steps of the transition relation. The counterexample is searched for over the states in the intersection.

26 Claims, 14 Drawing Sheets

SEARCHING FOR COUNTER-EXAMPLES INTELLIGENTLY

FIELD OF THE INVENTION

The present invention relates generally to design verification in transition systems and to reachability analysis in finite state machines, and specifically to hardware and software verification of integrated circuit design using methods of reachability analysis.

BACKGROUND OF THE INVENTION

Hardware verification is currently the bottleneck and the most expensive task in the design of a semiconductor integrated circuit. Model checking is a method of formal verification that is gaining in popularity for this purpose. The method is described generally by Clarke et al., in *Model Checking* (MIT Press, 1999), which is incorporated herein by reference.

To perform model checking of the design of a device, a verification engineer reads the definition and functional specifications of the device and then, based on this information, writes a set of properties (also known as a specification) that the design is expected to fulfill. The properties are written in a suitable specification language for expressing temporal logic relationships between the inputs and outputs of the device. A hardware model (also known as an implementation) of the design, which is typically written in a hardware description language, such as VHDL or Verilog, is then tested to ascertain that the model satisfies all of the properties in the set under all possible input sequences. Such testing is a form of reachability analysis, in that it verifies that beginning from an initial state, the device as designed will, under appropriate conditions, reach an intended final state. Additionally, the testing verifies that particular "bad" states will not be reached from an initial state of the device under any conditions.

Model checking is preferably carried out automatically by a symbolic model checking program, such as SMV, as described, for example, by McMillan in *Symbolic Model Checking* (Kluwer Academic Publishers, 1993), which is incorporated herein by reference. A number of practical model checking tools are available, among them RuleBase, developed by IBM, which is described by Beer et al. in "RuleBase: an Industry-Oriented Formal Verification Tool," in *Proceedings of the Design Automation Conference DAC'96* (Las Vegas, Nev., 1996), which is incorporated herein by reference.

Even if the verification engineer is able to detect the existence of a design defect, there is an additional need to construct a sequence of states and transitions (a path) that leads to the problematic state of the design. This path is called a counterexample. Having such a counterexample allows the engineer to assess the impact of the problem and to address the bug specifically during redesign. Recent research described by Aziz and Ganai in "Efficient Coverage Directed State Space Search," in *Proceedings of the International Workshop on Logic Synthesis* (Lake Tahoe, Calif., 1998), and by Dill and Yand in "Validation with Guided Search of the State Space," in *Proceedings of the 35th ACM/IEEE Design Automation Conference* (1998), have noted the importance of this constructive counterexample approach. Both of these articles are incorporated herein by reference.

The most commonly used method in industry of finding a counterexample is to do a type of breadth-first search (BFS) of all states reached from a starting state and see if a problem state is reached. Because BFS is an exhaustive search, it explores all possible transition paths between states. Often, however, some of the paths may be ruled out as potential counterexamples by simple methods. Also, BFS may not detect even a very simple counterexample until it has investigated many other paths. Thus, BFS may spend significantly more time and computational resources than are tolerable to the engineer in arriving at a solution.

Another approach has been to use a directed search, as described by Dill and Yand, cited earlier, and by Abraham et al., in "On Combining Formal and Informal Verification," in *Proceedings of the Computer Aided Verification Conference* (1997), which is incorporated herein by reference. In a directed search, a heuristic is used to assign scores to states. The scores are meant to represent the likelihood that the state is a member of a counterexample path. By ranking the states by their scores, the search is directed toward those states believed most likely to produce a counterexample.

The efficiency and efficacy of a directed search are highly dependent on the scoring heuristic employed. Methods of directed search known in the art use heuristics that are either chosen a priori by the user or are determined by pre-processing the model immediately prior to beginning the search. Choosing a good heuristic in advance is very difficult. Pre-processing to find a good heuristic can be extremely time consuming.

If a heuristic does not lead to the production of a counterexample when one is known to exist, the heuristic scores must be refined. One approach has been to refine the entire model, as described by Clarke et al., in "Counterexample-Guided Abstraction Refinement," in *Proceedings of the Computer Aided Verification Conference* (2000), which is incorporated herein by reference.

Any implementation of these approaches relies on an underlying data structure that can represent Boolean functions efficiently. This efficiency is measured by the amount of memory space required by the data structure to represent the function and by the time and complexity required to manipulate the data structures. The data structure of choice used by practitioners in the art has been the binary decision diagram (BDD). In particular, many of the approaches to finding counterexamples mentioned above use implicitly conjoined BDDs, as described by Dill and Hu in "Efficient Verification with BDDs using Implicitly Conjoined Invariants," in *Lecture Notes in Computer Science* 697 (Springer-Verlag, 1993), which is incorporated herein by reference. Some methods of manipulating BDDs are described by Ravi et al., in "Approximation and Decomposition of Binary Decision Diagrams," in *Proceedings of the 35th ACM/IEEE Design Automation Conference* (1998), by Ravi and Somenzi, in "High-Density Reachability Analysis," in *Proceedings of the IEEE International Conference on Computer Aided Design* (1994), and by Beer and Geist in "Efficient Model Checking by Automated Ordering of Transition Relation Partitions," in *Proceedings of the Computer Aided Verification Conference* (1994), which are incorporated herein by reference.

SUMMARY OF THE INVENTION

Preferred embodiments of the present invention provide an improved method for finding counterexamples in a transition system. The method is particularly useful in formal verification of hardware and software designs. A heuristic is constructed "on the fly" for use in choosing states of the system that are likely candidates to belong to counterexamples. When the current heuristic is discovered to be incorrect, it is refined based on knowledge of earlier mistakes. As a result, the process of refinement is efficient and low in overhead. When the correct heuristic is discovered, it identifies a small portion of the state space of the system in which it is known that a counterexample can be found. This portion of the state space can be searched quickly to find the counterexample.

In preferred embodiments of the present invention, a formal verification framework receives as part of its input a design model having the form of a transition system. The system comprises a set of states, including a subset of initial states and a subset of final states, along with a transition relation between the states. An operator of the system identifies a set of "bad" states, which should not be reachable from an initial state of the system if the model is correct.

The framework works in two directions to find a heuristic that will lead to a counterexample, i.e., a path from an initial state to a bad state. The system searches backwards from the bad states toward the initial states by estimating the minimum number of transition steps needed to reach a bad state from different points in the state space. The system searches forward from the initial states to find states that are reachable from the initial state by exploring those states previously known to be reachable and which have been estimated to be closest to the bad states. If the exploration does not find an overlap between the states found in the backward and forward searches, the estimate is refined for the relevant states. The process terminates when a bad state is found to be reachable from an initial state. At this point, the system finds a path from an initial state to a bad state by performing a breadth first search on the set of reachable states. This path is identified as a counterexample.

Thus, preferred embodiments of the present invention enable counterexamples to be identified efficiently by reducing the scope of the search that must be conducted, by estimating those states of the model more likely to be included in a counterexample, and by refining those estimates upon discovering their inaccuracy. Since only a small, relevant portion of the model is refined, preferred embodiments of the present invention are generally more efficient than methods known in the art, such as the method described in the above-mentioned article by Clarke et al., in which the entire model is refined. The present invention is broadly applicable, with minimal user involvement and, typically, requires significantly less time to run than methods previously known in the art.

In some preferred embodiments of the present invention, when working backward from the bad states, an intermediate state encountered is placed in a set representing the minimum number of transition steps needed to reach a bad state from the intermediate state. The system maintains lists $D_i$ initially comprising all states estimated to be i steps from a bad state. $D_0$ is thus a list of the bad states. A state's score is the lowest i such that $D_i$ contains the state. Preferred embodiments of the current invention do not explicitly maintain the states' scores, however.

The framework also builds and maintains a list of states it knows to be reachable from an initial state by choosing known reachable states that have low scores (referred to as candidates) and computing those states' successors according to the transition relation. The successors are added to the list of reachable states. This process is repeated until either a bad state is reached or until none of the computed successors have a lower score than any of the candidates (more specifically, until no candidate from $D_i$ has a successor in $D_{i-1}$). In the latter case, the framework heuristically refines its distance estimate for relevant intermediate states and adjusts $D_i$ accordingly. This may result in increasing the scores of some of the intermediate states. The framework then resumes the forward search process.

Preferably, when performing the forward search and finding that no candidate in $D_i$ has a successor in $D_{i-1}$, the framework refines its distance estimates for relevant states by repeatedly approximating $D_i$ with increasing exactness until the approximation no longer contains any of the candidates, and finding a new candidate from $D_i$ that does have a successor in $D_{i-1}$. It then resumes the forward search process by looking at $D_{i-1}$ to find a state with a successor in $D_{i-2}$, and so on. This process of repeated local estimation enables the verification system to construct counterexamples with enhanced efficiency by comparison with formal verification systems known in the art.

Preferred embodiments of the present invention use implicitly conjoined binary decision diagrams to represent sets of states, wherein each list $D_i$ is represented by implicitly conjoined binary decision diagrams.

Although preferred embodiments described herein are directed to methods for hardware verification, the principles of the present invention are similarly applicable to other areas of system analysis requiring reachability analysis, particularly systems represented as finite state machines and other transition systems.

There is therefore provided, in accordance with a preferred embodiment of the present invention, a method for finding a counterexample on a system of states, including one or more initial states and one or more bad states, and a transition relation among the states, including:

assembling a first set of the states known to be reachable from the initial states in accordance with the transition relation;

defining a second set of the states from which it is estimated that one of the bad states is reachable in accordance with the transition relation;

modifying the sets of the states until a definition of the second set is found such that from one or more of the states in an intersection of the first and second sets, there is at least one of the bad states that can be reached in a given number of steps of the transition relation; and searching for the counterexample over the states in the intersection.

Preferably, modifying the sets of the states includes iteratively modifying the first and second sets until the intersection is found. Further preferably, defining the second set of the states includes defining n+1 sets of the states, referred to as $D_0$ through $D_n$, wherein $D_0$ includes the bad states, such that for each value of an index i, which assumes values from 1 to n, it is estimated that one of the bad states can be reached in i steps of the transition relation from at least one of the states in $D_i$, and wherein modifying the second set includes:

(a) choosing as candidates a subset of the states from the intersection of $D_i$ and the first set;

(b) verifying that at least one of the candidates can reach one of the states in $D_{i-1}$ in one step of the transition relation;

(c) refining the estimate of $D_i$ when none of the candidates can reach in one step any of the states in $D_{i-1}$; and (d) repeating steps (a) through (c) until one of the candidates is verified to reach one of the states in $D_{i-1}$ in one step of the transition relation.

Most preferably, modifying the second set includes decrementing i, beginning from an initial value of n, and repeating steps (a) through (d) until one of the candidates is verified to reach one of the bad states in one step of the transition relation.

Preferably, searching for the counterexample includes performing a search over the first set of states, most preferably a breadth first search over the first set of states.

In a preferred embodiment, step (c) includes:

(e) producing a set $D'_{i-1}$ as a superset of $D_{i-1}$ which has a small representation size in a data structure used to represent the states;

(f) computing a set A' to approximate a set of the states from which the states in $D'_{i-1}$ can be reached in one step of the transition relation;

(g) increasing a precision of the approximation for A' until A' does not contain any of the candidates;

(h) producing a set A as a superset of A' that has a small representation size in the data structure but does not contain any of the candidates; and (i) computing the modified estimate of $D_i$ as the intersection of a previous estimate of $D_i$ and A.

Preferably, the data structure includes a binary decision diagram (BDD).

Additionally or alternatively, choosing the candidates includes finding a first state in the intersection of $D_i$ and the first set, and adding to the candidates further states from the intersection which are found to have a large measure of difference relative to the first state.

Preferably, assembling the first set of the states and defining the second set of the states include representing the states as implicitly conjoined binary decision diagrams (BDDs) of boolean variables that define the states.

In a preferred embodiment, the system includes a model of an electronic device, and the states represent states assumed by the device in operation, and the counterexample is indicative of a deviation of the model from a specification of the device.

In another preferred embodiment, the transition relation includes a transition function, and the system includes a finite state machine.

There is also provided, in accordance with a preferred embodiment of the present invention, apparatus for finding a counterexample on a system of states, including one or more initial states and one or more bad states, and a transition relation among the states, the apparatus including a verification processor arranged to assemble a first set of the states known to be reachable from the initial states in accordance with the transition relation, to define a second set of the states from which it is estimated that one of the bad states is reachable in accordance with the transition relation, to modify the sets of the states until a definition of the second set is found such that from one or more of the states in an intersection of the first and second sets, there is at least one of the bad states that can be reached in a given number of steps of the transition relation, and to search for the counterexample over the states in the intersection.

There is further provided, in accordance with a preferred embodiment of the present invention, a computer software product for finding a counterexample on a system of states, including one or more initial states and one or more bad states, and a transition relation among the states, the product including a computer-readable medium in which program instructions are stored, which instructions, when read by a computer, cause the computer to assemble a first set of the states known to be reachable from the initial states in accordance with the transition relation, to define a second set of the states from which it is estimated that one of the bad states is reachable in accordance with the transition relation, to modify the sets of the states until a definition of the second set is found such that from one or more of the states in an intersection of the first and second sets, there is at least one of the bad states that can be reached in a given number of steps of the transition relation, and to search for the counterexample over the states in the intersection.

BRIEF DESCRIPTION OF THE DRAWINGS

The present invention will be more fully understood from the following detailed description of the preferred embodiments thereof, taken together with the drawings in which.

DETAILED DESCRIPTION OF PREFERRED EMBODIMENTS

Figure 1:
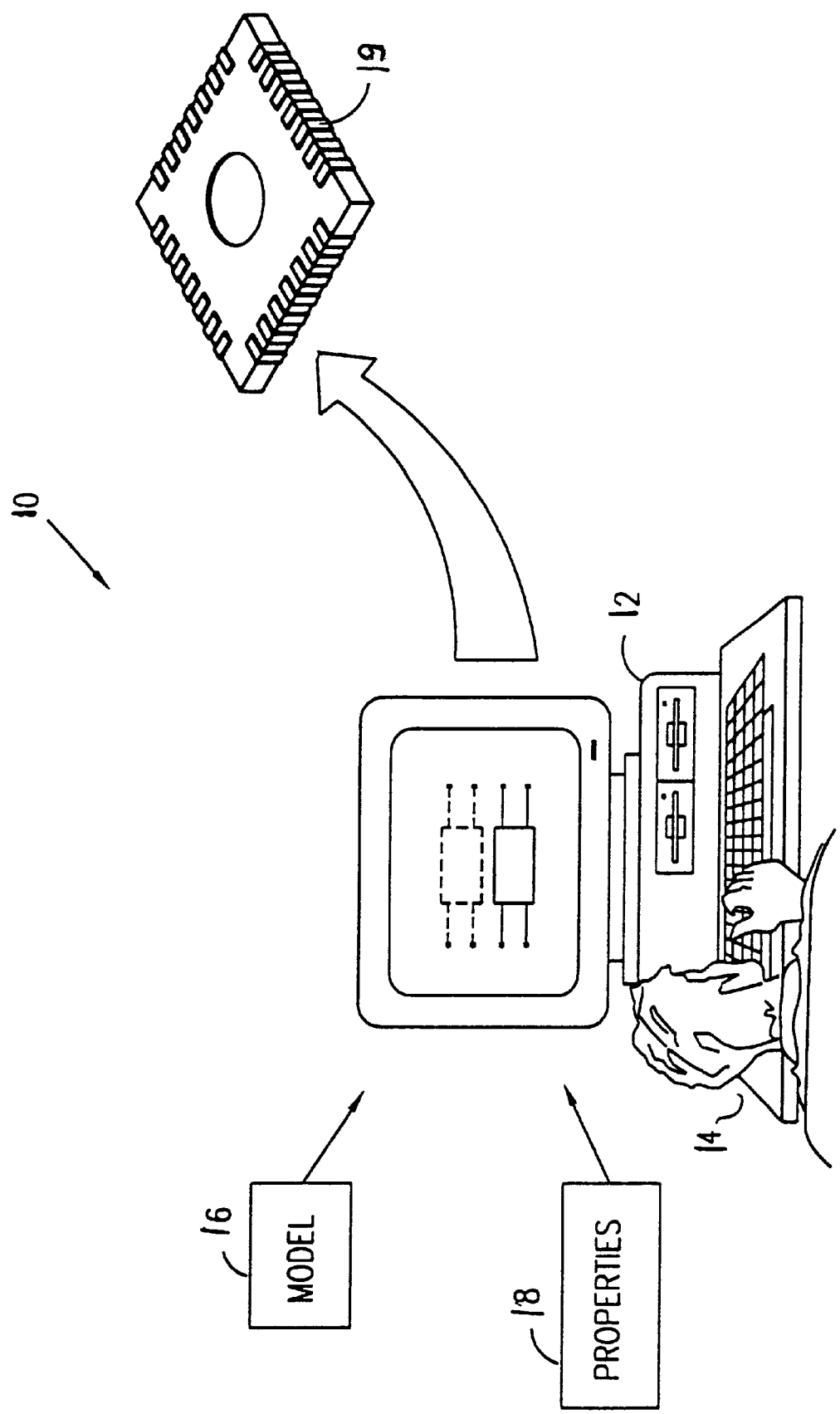
FIG. 1 is a schematic pictorial illustration showing a system for model checking, in accordance with a preferred embodiment of the present invention.

FIG. 1 is a schematic pictorial illustration of a system 10 for model checking, in accordance with a preferred embodiment of the present invention. System 10 comprises a verification processor 12, typically a general-purpose computer workstation running suitable model checking software, such as the above-mentioned IBM RuleBase, under the control of a verification engineer 14. The system receives a hardware implementation model 16 of a target system or device 19 in development. Engineer 14 prepares a specification of properties 18, for use in model checking of model 16. Included in the specification of properties is a set of bad states that should not be reachable from an initial state in the model. Assuming specification 18 does not correctly specify the model 16 and that a bad state is reachable from an initial state, system 10 produces a counterexample demonstrating the path from the initial state to the bad state, using methods described in detail hereinbelow.

Figure 2:
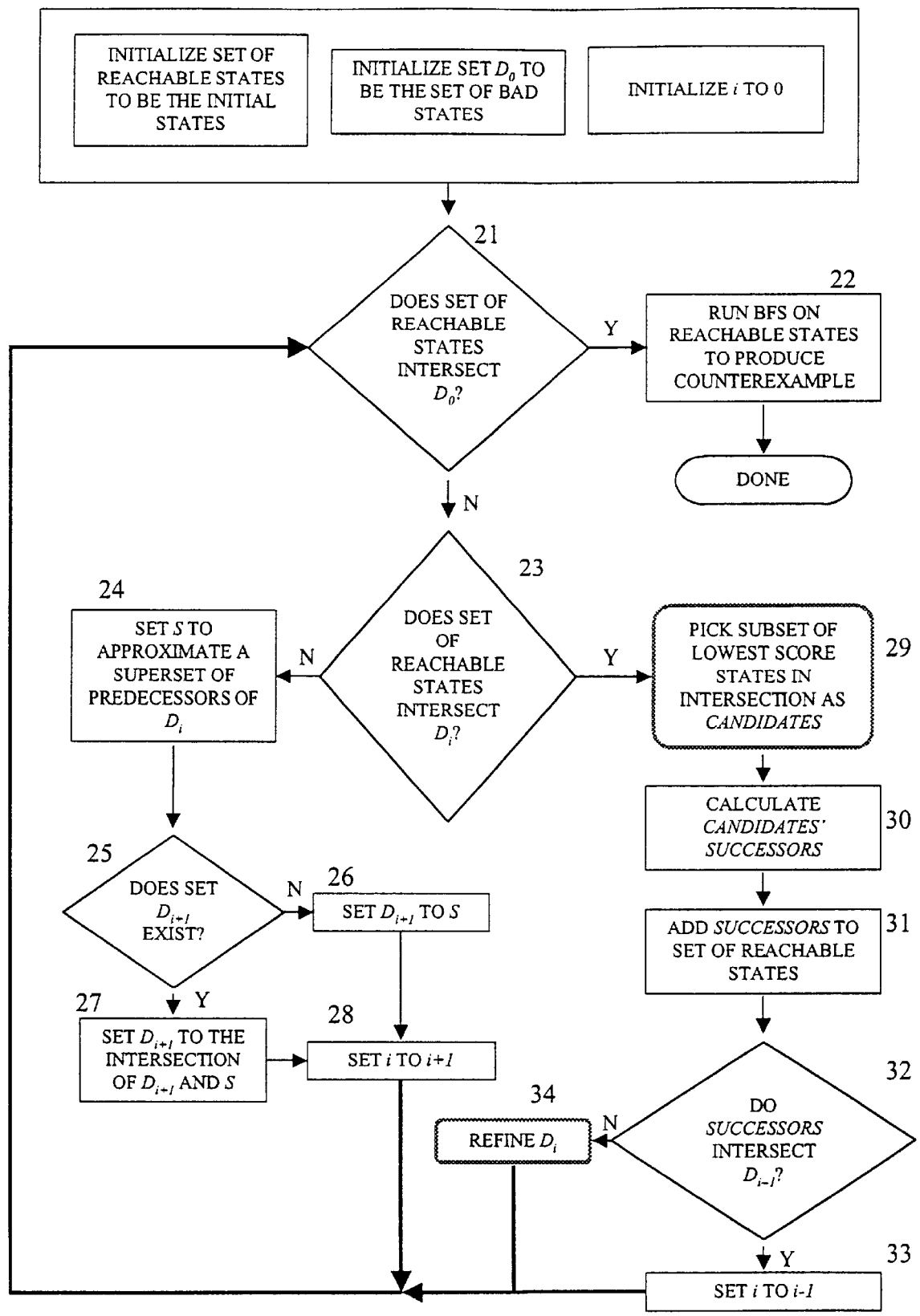
FIG. 2 is a flow chart that schematically illustrates a method for finding a counterexample in a transition system, in accordance with a preferred embodiment of the present invention.
Figure 3:
FIG. 3 is a Venn diagram that schematically illustrates the conditions required to terminate the method of FIG. 2, in accordance with a preferred embodiment of the present invention.
Figure 4:
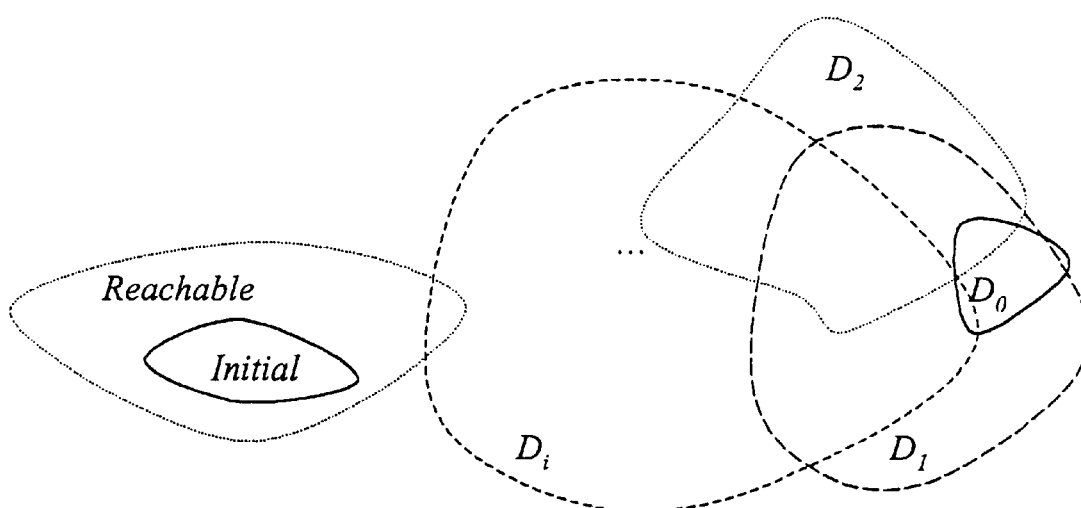
FIG. 4 is a Venn diagram that schematically illustrates the conditions required to iterate the method of FIG. 2, in accordance with a preferred embodiment of the present invention.

Reference is now made to FIGS. 2, 3, and 4. FIG. 2 is a flow chart that schematically illustrates a method for finding counterexamples in a state transition system, in accordance with a preferred embodiment of the present invention. FIGS. 3 and 4 are Venn diagrams that exemplify aspects of the operation of the method. This method is applied by system 10 in analyzing specification 18.

A state $s_k$ is said to be reachable from an initial state if there exists some sequence of states $(s_0, s_1, \ldots, s_k)$ where so is an initial state, and $(s_i, s_{i+1})$ for each $0 <= i < k$ is a legal transition according to the transition relation of the state transition system. The method of FIG. 2 begins by specifying a set of bad states $D_0$ in the system and creating a set of states known to be reachable from the initial states at an initialization step 20. An index i is initially set to 0. At each iteration of the method, the set of reachable states is compared with the set of bad states, at an initial state intersection step 21. If the reachable states include a bad state, a breadth-first search algorithm is performed on the reachable states, at a BFS step 22, to produce a counterexample. This situation is depicted in FIG. 3.

If no bad state is currently reachable, the process checks whether set $D_i$ is defined for the current value of i and if so, whether it includes any reachable states, at an incremented state intersection step 23. If not, the process works backwards from $D_i$ by approximating a set that includes all states that can reach the states of $D_i$ in one step of the transition relation, at a predecessor approximation step 24. A preferred method of predecessor approximation is described hereinbelow with reference to FIG. 10. State $s_{i-1}$ is a predecessor of state $s_i$ if $(s_{i-1}, s_i)$ is a legal transition according to the transition relation. The approximation created in step 24 is thus a superset of the predecessors of $D_i$ (i.e., it contains all the predecessors of $D_i$). At all times during the process, preferred embodiments of the present invention maintain the invariant property that $D_{i+1}$ is a superset of the predecessors of $D_i$ for all values of i.

Because system 10 works both forwards from the initial states and backwards from the bad states, a set $D_{i+1}$ may have been created at a previous iteration of the method of FIG. 2. This is checked at step 25. If no $D_{i+1}$ exists, the superset of predecessors, S, of the states in $D_i$ is designated as $D_{i+1}$ at step 26. If $D_{i+1}$ does exist, S is intersected with the existing $D_{i+1}$ to form a new version of set $D_{i+1}$ at step 27. Because set S and the old set $D_{i+1}$ were both supersets of the predecessors of $D_i$, their intersection, the new $D_{i+1}$, is also a superset of the predecessors of $D_i$. In fact, the new $D_{i+1}$ will be a more exact approximation of predecessor states to $D_i$ than any previous $D_{i+1}$. The index i is then incremented at step 28. Thus, on the first n iterations, the process builds sets $D_1$ to $D_n$, wherein n is the lowest integer such that $D_n$ includes an initial state of the system. A state's score is defined to be the lowest i such that the state is in $D_i$.

If at step 23, a reachable state is found in $D_i$, then the process checks whether particular states in $D_i$ actually lead to $D_{i-1}$ in one transition step of the system. This corresponds to the "Y" branch of intersection step 23 and is depicted in FIG. 4. Because $D_i$ is merely an approximation of the predecessors of $D_{i-1}$, it may contain additional states that are not predecessors of $D_{i-1}$. Of the reachable states in $D_i$ with lowest score, only a subset are chosen to be candidates for further processing, using a subset selection procedure 29. The candidates' successors are then calculated according to the system transition relation and are added to the set of reachable states at steps 30 and 31, respectively. If any of the successors are in $D_{i-1}$, then the index i is decremented at step 33 and another iteration begins.

If none of the candidates' successors are found in $D_{i-1}$, then set $D_i$ goes through a refinement procedure 34 to produce a more exact approximation to the predecessors of $D_{i-1}$. Procedure 34 provides advantages over methods for finding counterexamples previously known in the art by refining earlier approximations according to mistakes made in those approximations and by refining, at each iteration, only a local, relevant part of the approximation.

Figure 5:
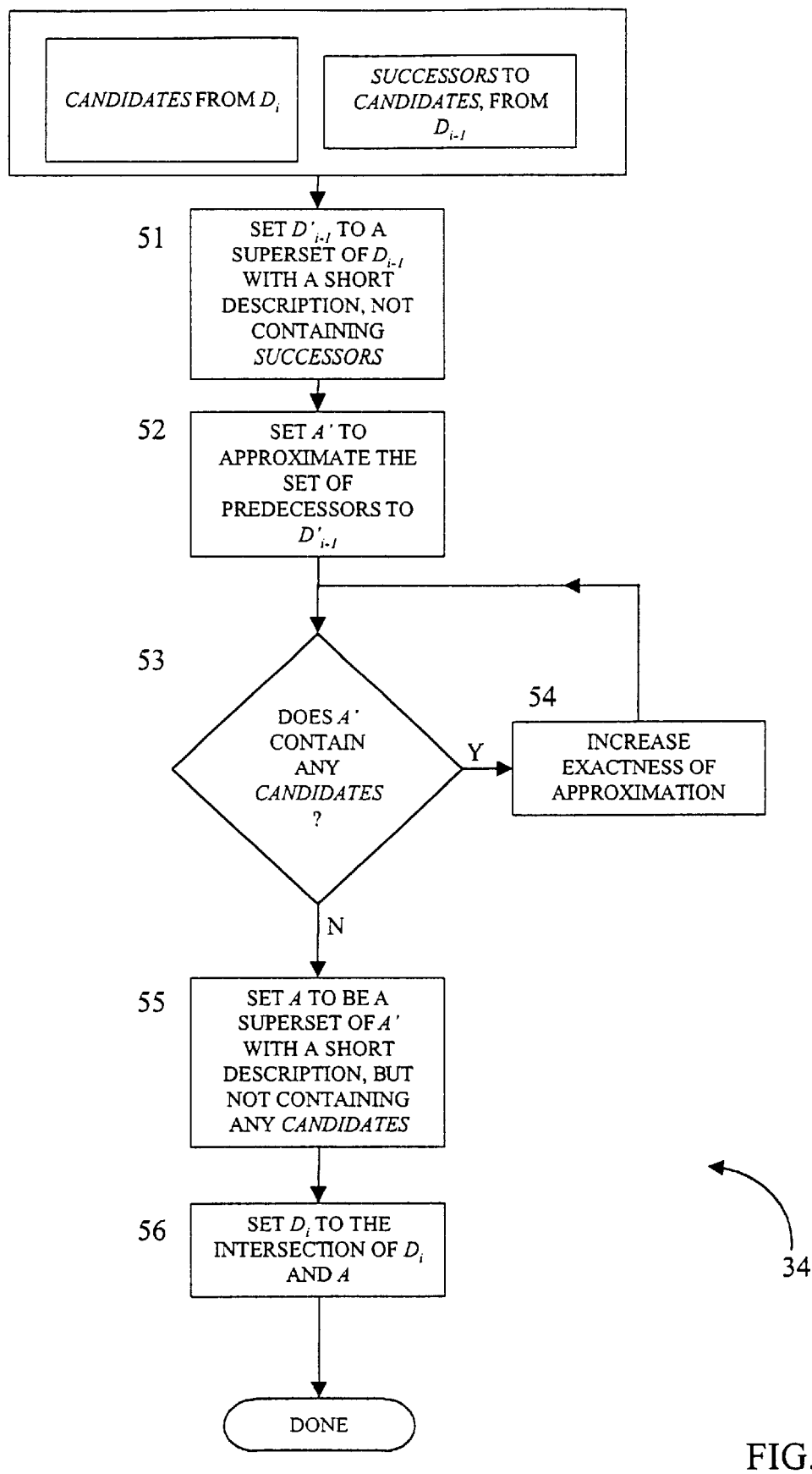
FIG. 5 is a flow chart that schematically illustrates a refinement procedure used in the method of FIG. 2, in accordance with a preferred embodiment of the present invention.
Figure 6:
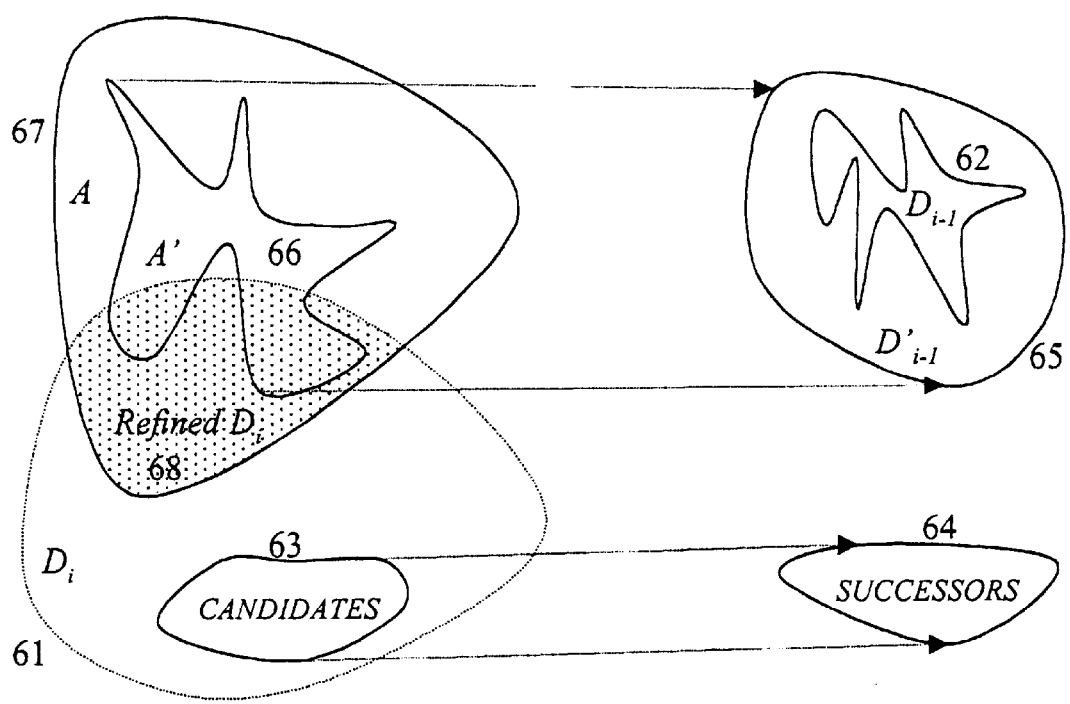
FIG. 6 is a Venn diagram that schematically illustrates the refinement procedure of FIG. 5, in accordance with a preferred embodiment of the present invention.

Reference is now made to FIGS. 5 and 6, which schematically illustrate procedure 34 for refining approximation $D_i$, in accordance with a preferred embodiment of the present invention. FIG. 5 is a flow chart, while FIG. 6 is a Venn diagram that exemplifies aspects of the procedure. The procedure takes as its input $D_i$, $D_{i-1}$, the set of candidates, and the set of the candidate's calculated successors. These sets are represented as sets 61, 62, 63 and 64, respectively, in FIG. 6. The refinement procedure of FIG. 5 constructs a superset of the predecessors of $D_{i-1}$ that is different from $D_i$. This new superset will have a simple description using a preferred data structure, but will not include the candidates, which are now known not to have any successors in $D_{i-1}$. The states included in the set produced by refining procedure 34 will have representations in a preferred data structure, most preferably a binary decision diagram, that are distinguishable, yet very similar to one another. This provides an advantage of reducing the time and memory required to run the procedure while preserving the relevant information about the individual states.

The procedure begins, at an approximation step 51, by computing a set $D'_{i-1}$ (set 65) that is a superset of $D_{i-1}$ but does not contain any successors 64 of candidates 63 and has a simple description in a preferred data structure. Details of this approximation as implemented in a preferred embodiment of the present invention are described hereinbelow with reference to FIG. 11. A set A' (set 66) is then approximated, at an approximation step 52, so as to include all predecessors of $D'_{i-1}$. If A' contains any candidates 63, identified at a candidate finding step 53, the approximation is made increasingly exact, by a precision increasing step 54, until A' does not contain any candidates. Details of steps 52 through 54 as implemented in a preferred embodiment of the present invention are described hereinbelow with reference to FIG. 12.

Step 54 may result in a set A' that is difficult to describe with a preferred data structure, such as a BDD. A set A (set 67) is therefore taken in a simplifying step 55 as a superset of A'. A is chosen so as to have a simple description in the preferred data structure while still not containing any candidates. Finally, a new set $D_i$ (set 68) is taken as the intersection of the old set $D_i$ (set 61) and A (set 67) in an intersection step 56. Details of steps 55 and 56 as implemented in a preferred embodiment of the present invention are described hereinbelow with reference to FIG. 13. Because the old $D_i$ (set 61) and A (set 67) are both supersets of the predecessors of $D_{i-1}$ (set 62), their intersection, which forms the new $D_i$ (set 68), is also a superset of the predecessors of $Di_1$. This maintains the invariant property that $D_i$ is a superset of the predecessors of $D_{i-1}$ for all values of i.

Figure 7:
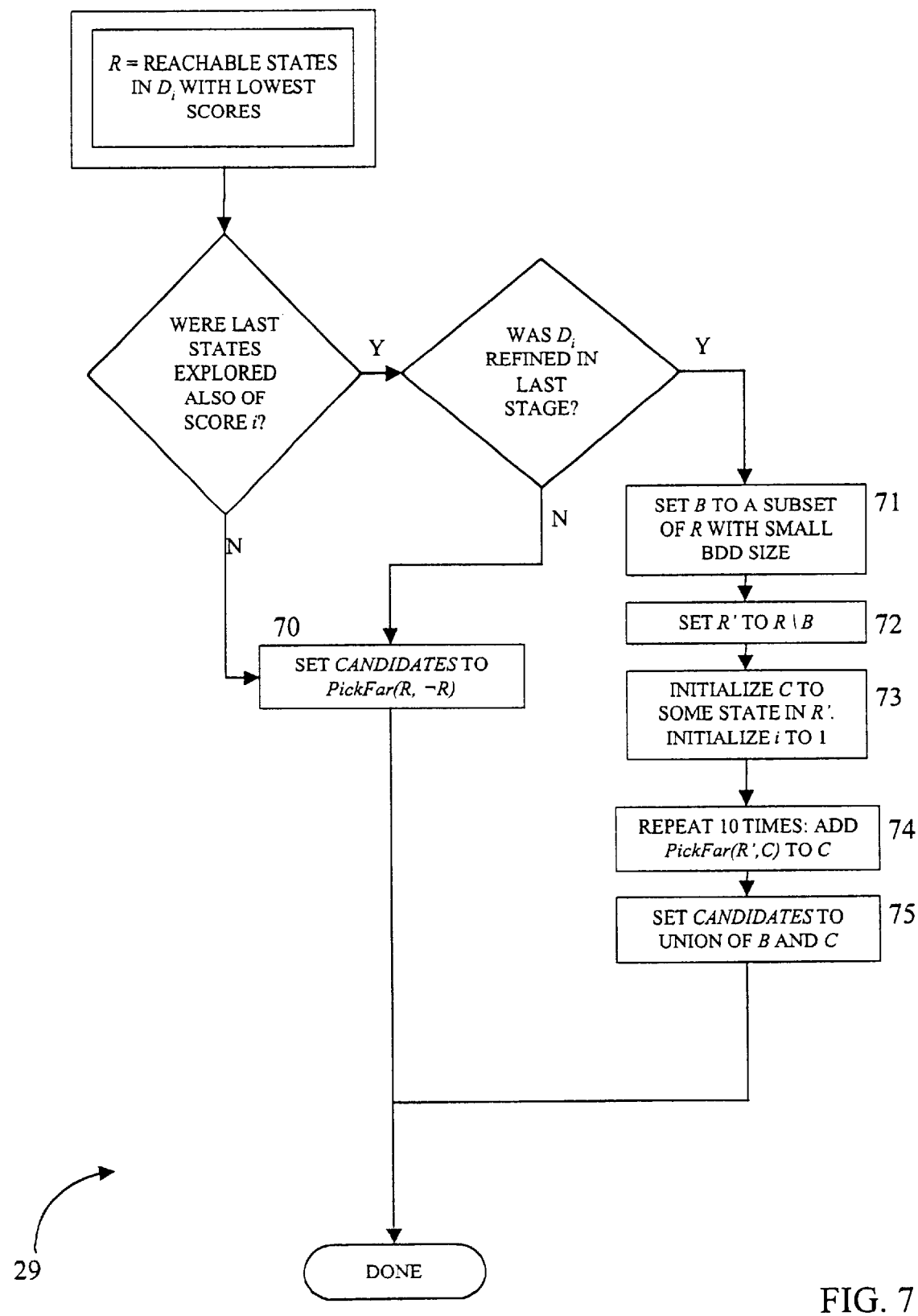
FIG. 7 is a flow chart that schematically illustrates a procedure for picking candidate states, used in the method of FIG. 2, in accordance with a preferred embodiment of the present invention.

FIG. 7 is a flow chart that schematically illustrates details of procedure 29, used in the method of FIG. 2 for picking the set of candidates in $D_i$, in accordance with a preferred embodiment of the present invention. As described above, the candidates are chosen from among the states with the lowest scores that are reachable from an initial state of the system. The procedure takes as input a set R consisting of the reachable states in $D_i$ with the lowest scores. There are two cases to consider. First, if the set $D_i$ was not refined in the previous iteration through the method of FIG. 2, or if the last states taken as candidates did not have score i, then only one state is taken to be a candidate, in a single candidate step 70. This state is chosen using a procedure that guarantees that the candidate is as far as possible from an outer boundary of set R, according to a preferred metric. Choosing only a single candidate that, according to a preferred metric, is a good representative of the best possible candidates, increases overall efficiency if refinement is needed in a subsequent step. If the representative state does not have a successor in $D_{i-1}$, then the subsequent refinement procedure will remove from $D_i$ not only the representative state, but also a large number of nearby states, according to the preferred metric. The procedure used in step 70, referred to hereinafter as PickFar, is described in detail with reference to FIG. B.

The second case occurs if the set $D_i$ was refined in the previous iteration, and the last states taken as candidates had score i. The set of candidates from the previous iteration, however, did not have any successors in $D_{i-1}$. The set of candidates must therefore be enlarged. A set B is constructed as a subset of R with a simple description in the preferred data structure, in a subset construction step 71. In a preferred embodiment of the present invention, this step is accomplished by manipulation of BDDs using methods known in the art, such as those described in the above-mentioned article by Ravi, et al. A new set R' is defined as R\B (the set of states in R, but not in B), at a set definition step 72, and a temporary set C is initialized to some state in R', at an initialization step 73. A number of states, preferably ten such states, are then chosen from R', such that they are well-spread across R', and are added to C, in a PickFar step 74. The PickFar procedure, as described below, is used to choose the states. A union of sets B and C then form the new set of candidates, in a union step 75. This procedure keeps the number of candidates relatively low and with simple description in the preferred data structure. This has the advantages of easing the calculation of the candidates' successors and of easing the refinement procedure should $D_i$ need refinement, using procedure 34. Additionally, using the PickFar procedure guarantees that the added states are good representatives within R', and that should a subsequent refinement of $D_i$ be necessary, it will remove a large number of states that are near the added states, according to the preferred metric.

Figure 8:
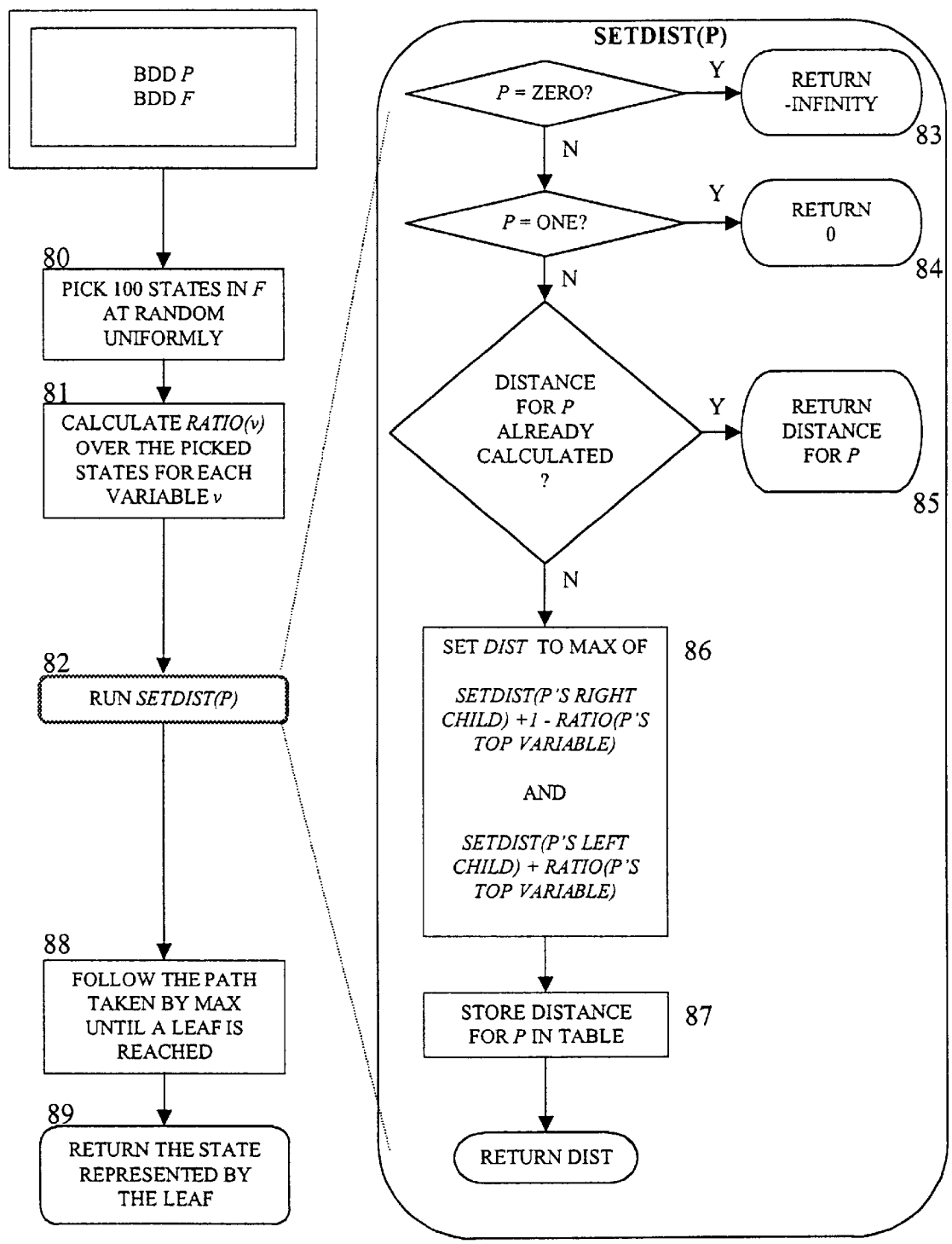
FIG. 8 is a flow chart that schematically illustrates a procedure for picking a state from a first binary decision diagram that has maximum average distance to states in a second binary decision diagram, in accordance with a preferred embodiment of the present invention.
Figure 9:
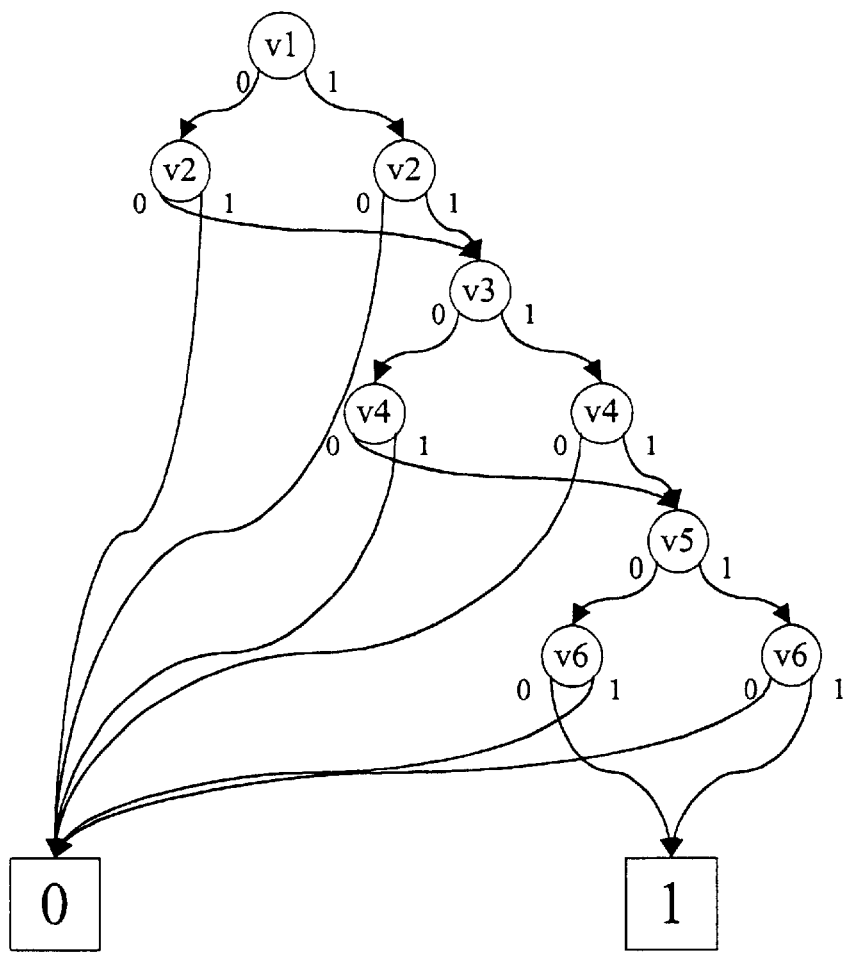
FIG. 9 is a diagram that graphically depicts an example of a binary decision diagram.

Reference is now made to FIGS. 8 and 9. FIG. 8 is a flow chart that schematically illustrates the PickFar procedure used in steps 70 and 74, in accordance with a preferred embodiment of the present invention. This procedure is used for picking from one set of states P a state that has maximum average distance with respect to a second set of states F. The states in both P and F are indexed by assignments to Boolean variables $v_1, \ldots, v_m$. The distance between two states is defined as the number of variables on which the states' indices differ. The input sets P and F are represented by binary decision diagrams (BDDs) over the Boolean variables used to index the states.

An example of a BDD is given in FIG. 9. The binary decision diagram of FIG. 9 represents the set of states {000000, 110000, 001100, 000011, 111100, 110011, 001111, 111111}, wherein the states are indexed over the variables $v_1, \ldots, v_6$. The BDD in FIG. 9 is rooted at variable $v_1$.

The PickFar procedure begins by picking a large sample of states from F, typically one hundred such states, drawn randomly with each state equally likely to be drawn, at a sampling step 80. For each variable $v_i$ used to index the states, PickFar then computes the number of states in the sample that have $v_i$ equal to 1 in their indices. This number divided by the number of states in the sample is then stored as Ratio($v_i$), at a ratio step 81.

A recursive procedure SetDist(P) 82 constructively computes the maximum average distance between states of P and the sample of states from F. SetDist takes as its input a BDD P representing the set of states. Starting at the root node of P, SetDist runs recursively on each of the node's children. If a 0-leaf is encountered, the value negative infinity is returned at a step 83. If a 1-leaf is encountered, the value zero is returned at a step 84. If SetDist for the sub-BDD rooted at the current child has already been computed, its value is retrieved from a lookup table at a retrieval step 85, and the value for that sub-BDD need not be explicitly computed again. Otherwise, the value returned by SetDist(P) is computed to be the maximum of [1+SetDist(P's right child)−Ratio(P's top variable)] and [SetDist(P's left child)+Ratio(P's top variable)], at a step 86. This distance value is stored in the lookup table, at a step 87.

At the termination of SetDist (P), there is a path along the binary decision diagram nodes leading from the root to a leaf that represents the state whose average distance to the sample from F is maximal. The PickFar procedure follows this path to find the represented state, in a traversal step 88.

Figure 10:
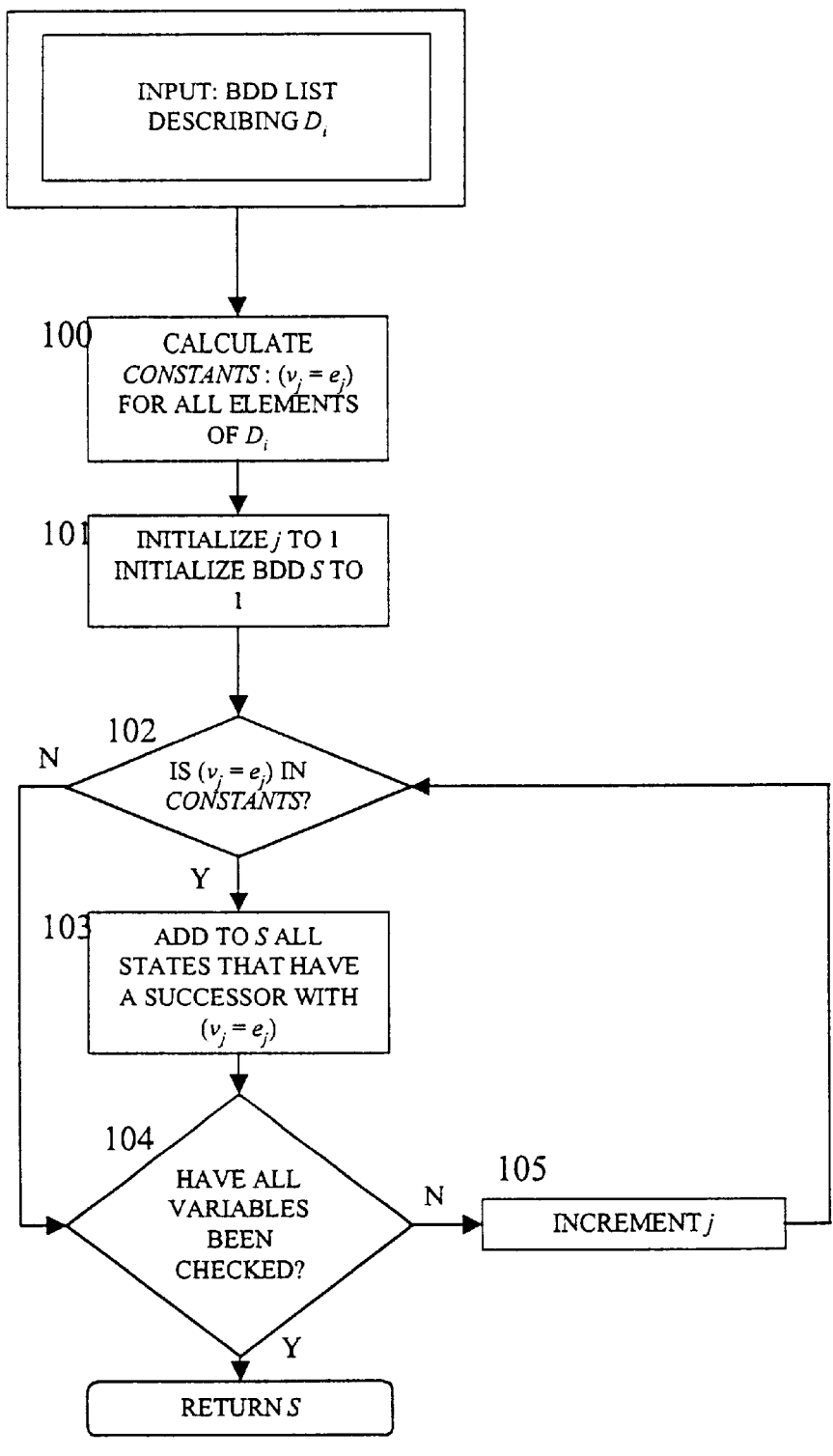
FIG. 10 is a flow chart that schematically illustrates a procedure for creating a conjoined binary decision diagram that approximates the predecessors of a second binary decision diagram, used in the method of FIG. 2, in accordance with a preferred embodiment of the present invention.

FIG. 10 is a flow chart that schematically illustrates the initial approximation procedure used in approximation step 24 (FIG. 2), in accordance with a preferred embodiment of the present invention. Approximation step 24 is of particular importance during the initial backwards pass of the system, when the sets $D_1$ to $D_n$ are created. The procedure takes as its input a BDD describing set $D_i$. Each state in $D_i$ is indexed over variables $v_1$ to $v_m$. The procedure begins by calculating all variables $v_j$ such that the value of $v_j$ is constant in all the states of $D_i$. This is done at a calculation step 100, and can be accomplished in a single pass through the BDD. Let the value of the constant be $e_j$. The procedure initializes both a counter variable j and a BDD list S to a value of 1, in an initialization step 101. The procedure checks for each variable $v_j$ whether $v_j$ is of constant value for all states in $D_i$, at a constant checking step 102. If $V_j$ is a constant, then a BDD representing all states that have a successor with $v_j=e_j$ is appended to S in a BDD conjunction step 103. After all variables have been checked, BDD list S is returned as an approximation of the predecessors of $D_i$.

Figure 11:
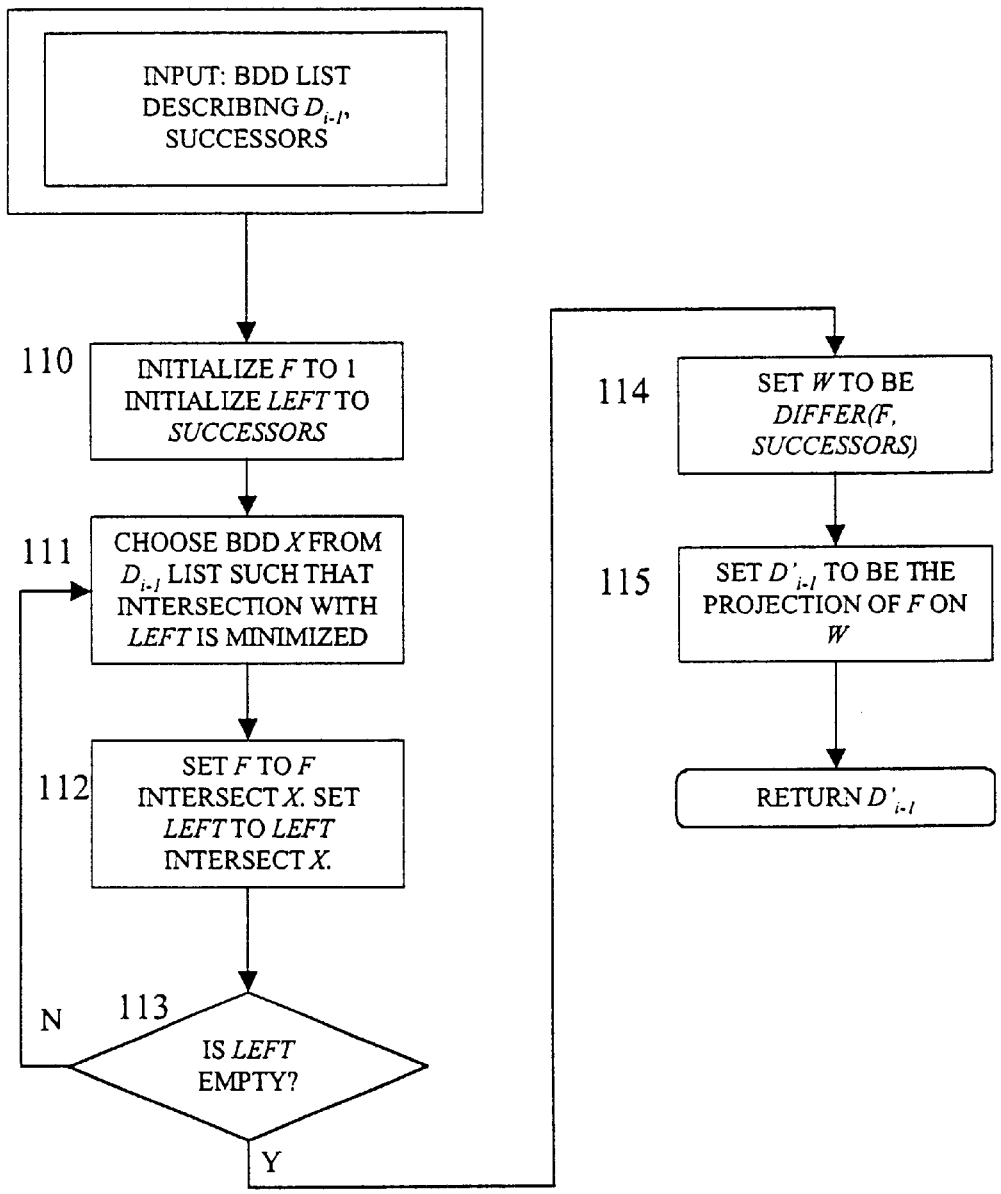
FIG. 11 is a flow chart that schematically illustrates details of the refinement procedure of FIG. 5, in accordance with a preferred embodiment of the present invention.

FIG. 11 is a flow chart that schematically illustrates details of approximation step 51, used in refinement procedure 34, shown in FIG. 5, in accordance with a preferred embodiment of the present invention. As noted above, procedure 34 computes a set $D'_{i-1}$ that is a superset of $D_{i-1}$ but does not contain any successors of the candidates and has a simple BDD description. The procedure begins by initializing a set Left to be the set of successors, and a BDD F to be 1 (i.e., F represents the set of all states), in an initialization step 110. A BDD X is chosen from the conjoined list of BDDs describing $D_{i-1}$ such that the intersection of Left and X is minimized, at an intersection minimization step 111. F is then updated to represent the intersection of F and X, while Left is updated to represent the intersection of Left and X, in an updating step 112. Left is checked to see if it still contains any states, at an emptiness checking step 113. If Left is not empty, steps 111 through 113 are repeated.

If Left is empty, then F must be a single BDD that is a superset of $D_{i-1}$ and does not contain any successors of the candidates. In the next steps, F is further approximated so that it will contain a small number of variables. Using a Differ procedure, detailed later with reference to FIG. 14, a set W of variables is found, at a variable finding step 114, such that the variables of W suffice to distinguish between the states of F and the successors. Set $D'_{i-1}$ is then calculated as the projection of F on W, at a projection step 115. The definition of the Differ procedure guarantees that $D'_{i-1}$ does not intersect the set of successors.

Figure 12:
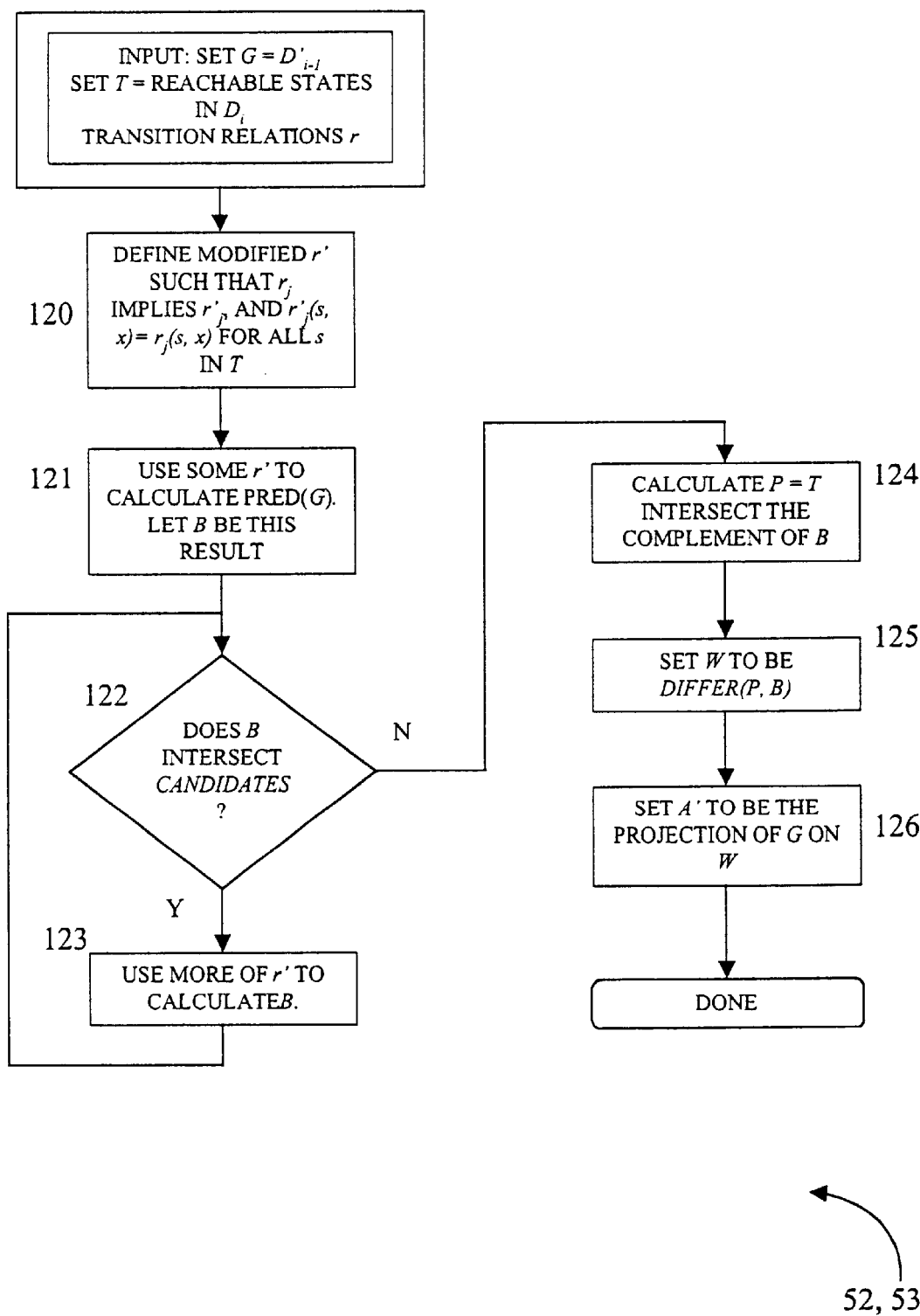
FIG. 12 is a flow chart that schematically illustrates further details of the refinement procedure of FIG. 5, in accordance with a preferred embodiment of the present invention.

FIG. 12 is a flow chart that schematically illustrates details of approximation step 52, used in refinement procedure 34, shown in FIG. 5, in accordance with a preferred embodiment of the present invention. FIG. 12 also shows details of steps 53 and 54, for increasing the precision of the approximation. As noted above, these steps are used to find the set A' that approximates the set of predecessors to $D'_{i-1}$ and contains none of the previous candidates.

The procedure of FIG. 12 takes as input the set $D'_{i-1}$ and the set T of states in $D_i$ known to be reachable from an initial state. It begins by modifying the transition relation r, at a transition relation modification step 120, using a technique described in the above-mentioned article by Ravi, et al. In a preferred embodiment of the present invention, the transition relation r is defined as m different (m+1)-ary relations, $r_1$ to $r_m$, wherein m is the number of Boolean variables indexing the states. Relation $r_i(x_1, x_2, \ldots, x_m, x)$ is true if and only if x is a legal value of $v_i$ in some successor of the state indexed by $(x_1, x_2, \ldots, x_m)$. The modified relation r' has the properties that, for each i, $r'_i(x_1, x_2, \ldots, x_m, x)$ is true if $r_i(x_1, x_2, \ldots, x_m, x)$ is true, and $r'_i(x_1, x_2, \ldots, x_m, x)=r_i(x_1, x_2, \ldots, x_m, x)$ if $(x_1, x_2, \ldots, x_m)$ is a state in T. Because the transition relations are represented as BDDs, the relations of r' can be represented by much smaller BDDs than the relations of r, making the calculation of predecessor approximations much more efficient.

Using only some of the modified relations from r', a set B is calculated that approximates the predecessors of $D'_{i-1}$ at a predecessor calculation step 121. Set B is checked to make sure it does not contain any of the candidates, at an intersection checking step 122. If B does contain candidates, then more of the modified relations r' are used to calculate B, at a predecessor calculation step 123, until B does not contain any of the candidates. At that point, set P is calculated as the intersection of T with the complement of B, at an intersection calculation step 124. Using a Differ procedure, described later with reference to FIGS. 14 and 15, a set of variables W that distinguishes between P and B is calculated, at a variable calculation step 125. Set A' is then calculated as the projection of the predecessors of $D'_{i-1}$ on W, at a projection calculation step 126, using a generalization of the technique described in the above-mentioned article by Beer and Geist. Set A' is an approximation of the predecessors of $D'_{i-1}$, and A' agrees with the actual predecessors of $D'_{i-1}$ on set T. In other words, all of the states of A' that are also in T are actual predecessors of $D'_{i-1}$, and all of the actual predecessors of $D'_{i-1}$ that are in T are included in A'.

Figure 13:
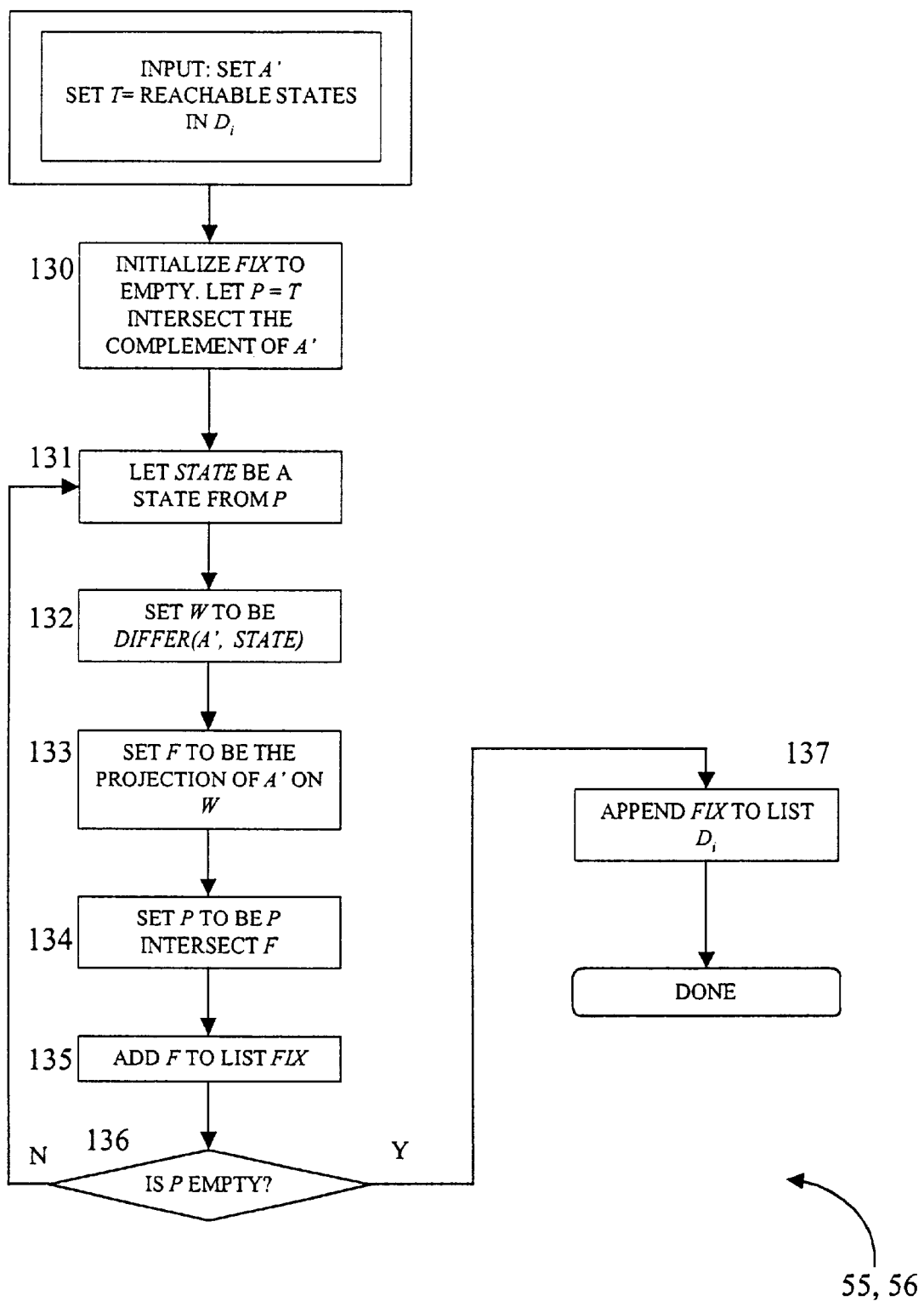
FIG. 13 is a flow chart that schematically illustrates still further details of the refinement procedure of FIG. 5, in accordance with a preferred embodiment of the present invention.

FIG. 13 is a flow chart that schematically illustrates details of simplifying step 55 and intersection step 56 in refinement procedure 34, shown in FIG. 5, in accordance with a preferred embodiment of the present invention. In these steps, a set of states is found that contains predecessors of the set of states $D_{i-1}$ and has a short description as a conjoined binary decision diagram (BDD). The procedure takes as input the set A' created by the steps shown in FIG. 12, and the set T of states in $D_i$ known to be reachable from an initial state. The output of the procedure is a conjoined BDD list that approximates A', using a smaller number of variables.

The procedure begins by initializing an empty BDD list, Fix, and calculating set P as the intersection of T and the complement of A', at an initialization step 130. It then chooses any state, State, from P at a state picking step 131. In a preferred embodiment of the present invention, step 131 is accomplished by using the PickFar procedure, described hereinabove with reference to FIG. 8. A set of variables, W, is then calculated using a Differ procedure, detailed later with reference to FIG. 14, such that the variables of W suffice to distinguish between A' and State, at a variable finding step 132. Set F is calculated as the projection of A' on W, at a projection step 133. Set P is then reduced by intersecting it with set F at an intersection step 134. The BDD for F is appended to the BDD list Fix, at a BDD conjunction step 135. Set P is then checked for emptiness at an emptiness checking step 136. If P is not empty, steps 131 through 136 are repeated. If P is empty, then the BDD list Fix is appended to the BDD list for set $D_i$ at a BDD conjunction step 137.

Figure 14:
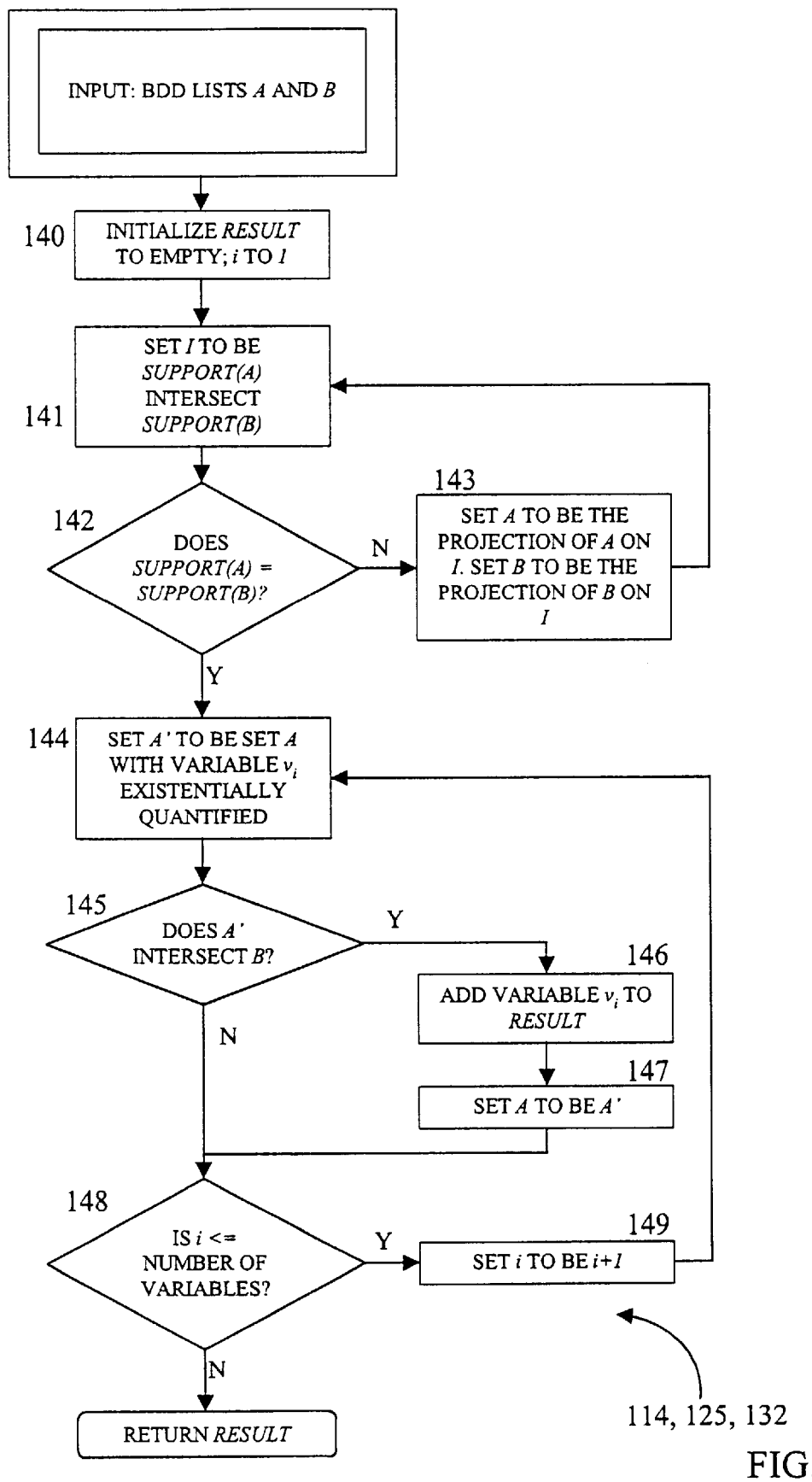
FIG. 14 is a flow chart that schematically illustrates a procedure for distinguishing between two binary decision diagrams, in accordance with a preferred embodiment of the present invention.

FIG. 14 is a flow chart that schematically illustrates details of the procedure Differ(A,B), used in the methods of FIGS. 11–13, in accordance with a preferred embodiment of the present invention. This procedure takes as input two non-intersecting BDDs and returns a small set of variables that can distinguish between the two sets represented by the BDDs. Although no procedure is known that absolutely minimizes the number of variables needed to distinguish between A and B in a reasonable amount of time (this problem is known to be NP-hard), the Differ procedure implements a heuristic that produces a relatively small number of variables. This procedure is used in the above-mentioned article by Clarke, et al.

The procedure of FIG. 14 begins by initializing an empty set Result of variables, and setting an index variable i to 1, at an initialization step 140. A set of variables I is calculated as the intersection of Support(A) and Support(B) at an intersection step 141. Support of a BDD is the set of variables appearing in the BDD. Support(A) is compared to Support(B) in a comparison step 142. If Support(A) does not equal Support(B), then A is reset to be the projection of A on the variables of I, and B is reset to be the projection of B on the variables of I at a projection step 143, and intersection step 141 and comparison step 142 are repeated. If Support (A)=Support(B), then BDD $A^i$ is calculated as the BDD A with variable $v_i$ existentially qualified, at a qualification step 144. BDD $A^i$ is checked to see if it intersects B, at an intersection checking step 145. If $A^i$ intersects B, then variable $v_i$ is added to Result at a variable accumulation step 146. If $A^i$ does not intersect B, then no variable is added to Result, but A is reset to be $A^i$ at a resetting step 147. If index i is not yet greater than the number of variables, as checked at an index checking step 148, then i is incremented at an incrementation step 149, and steps 144 through 148 are repeated.

Figure 15:
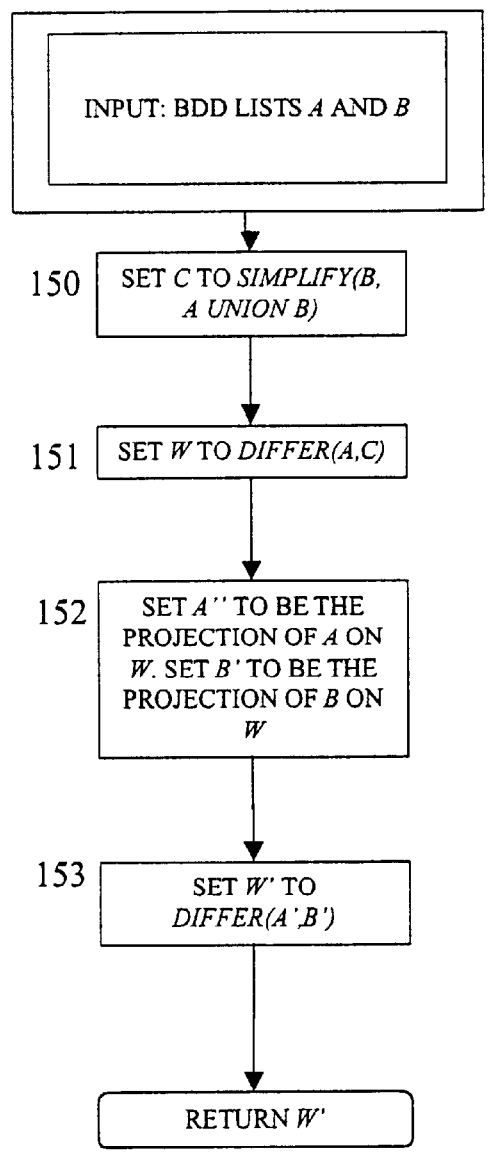
FIG. 15 is a flow chart that schematically illustrates another procedure for distinguishing between two binary decision diagrams, in accordance with a preferred embodiment of the present invention

FIG. 15 is a flow chart that schematically illustrates details of an improved Differ procedure, in accordance with another preferred embodiment of the present invention. This procedure, like the procedure of FIG. 14, takes as input two non-intersecting BDDs and returns a small set of variables that can distinguish between the two sets represented by the BDDs. The improved procedure gives significantly better results in many practical instances. It is most effective when a set B is the larger BDD of A and B, and set A is very small.

The procedure begins by using the Simplify operation proposed in the above-mentioned article by Ravi, et al., to calculate a set C as Simplify(B, A union B) at a simplifying step 150. A set W of variables is then calculated as Differ(A, C), at a variable finding step 151. Set A' is calculated as the projection of A on the variables of W, and B' is calculated as the projection of B on the variables of W, at a projection step 152. The properties of the Simplify operation and the Differ procedure guarantee that A' and B' do not intersect. A new set W' of variables is then calculated as Differ(A', B'), at a variable finding step 153.

Although preferred embodiments described herein are directed to methods for hardware verification, the principles of the present invention are similarly applicable for solving connectivity problems in other systems. These systems can generally be represented by graphs (finite or infinite), in which it is necessary to find a path between two subsets of the vertices in the graph. This approach can be used for debugging hardware, software and other transition systems.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for finding a counterexample on a system of states, including one or more initial states and one or more bad states, and a transition relation among the states, comprising:

assembling a first set of the states known to be reachable from the initial states in accordance with the transition relation;

defining a second set of the states from which it is estimated that one of the bad states is reachable in accordance with the transition relation;

modifying the sets of the states until a definition of the second set is found such that from one or more of the states in an intersection of the first and second sets, there is at least one of the bad states that can be reached in a given number of steps of the transition relation; and searching for the counterexample over the states in the intersection.

2. The method according to claim 1, wherein modifying the sets of the states comprises iteratively modifying the first and second sets until the intersection is found.

3. The method according to claim 1, wherein assembling the first set of the states and defining the second set of the states comprise representing the states as implicitly conjoined binary decision diagrams (BDDs) of boolean variables that define the states.

4. The method according to claim 1, wherein the system comprises a model of an electronic device, and wherein the states represent states assumed by the device in operation, and wherein the counterexample is indicative of a deviation of the model from a specification of the device.

5. The method according to claim 1, wherein the transition relation comprises a transition function, and the system comprises a finite state machine.

6. A method for finding a counterexample on a system of states, including one or more initial states and one or more bad states, and a transition relation among the states, comprising:

assembling a first set of the states known to be reachable from the initial states in accordance with the transition relation;

defining a second set of the states from which it is estimated that one of the bad states is reachable in accordance with the transition relation;

modifying the sets of the states until a definition of the second set is found such that from one or more of the states in an intersection of the first and second sets, there is at least one of the bad states that can be reached in a given number of steps of the transition relation; and searching for the counterexample over the states in the intersection wherein modifying the sets of the states comprises iteratively modifying the first and second sets until the intersection is found, and wherein defining the second set of the states comprises defining n+1 sets of the states, referred to as $D_0$ through $D_n$, wherein $D_0$ comprises the bad states, such that for each value of an index i, which assumes values from 1 to n, it is estimated that one of the bad states can be reached in i steps of the transition relation from at least one of the states in $D_i$, and wherein modifying the second set comprises:

(a) choosing as candidates a subset of the states from the intersection of $D_i$ and the first set;

(b) verifying that at least one of the candidates can reach one of the states in $D_{i-1}$ in one step of the transition relation;

(c) refining the estimate of $D_i$ when none of the candidates can reach in one step any of the states in $D_{i-1}$; and (d) repeating steps (a) through (c) until one of the candidates is verified to reach one of the states in $D_{i-1}$ in one step of the transition relation.

7. The method according to claim 6, wherein modifying the second set comprises decrementing i, beginning from an initial value of n, and repeating steps (a) through (d) until one of the candidates is verified to reach one of the bad states in one step of the transition relation.

8. The method according to claim 6, wherein searching for the counterexample comprises performing a search over the first set of states.

9. The method according to claim 8, wherein performing the search comprises performing a breadth first search over the first set of states.

10. The method according to claim 6, wherein step (c) comprises:

(e) producing a set $D'_{i-1}$ as a superset of $D_{i-1}$ which has a small representation size in a data structure used to represent the states;

(f) computing a set A' to approximate a set of the states from which the states in $D'_{i-1}$ can be reached in one step of the transition relation;

(g) increasing a precision of the approximation for A' until A' does not contain any of the candidates;

(h) producing a set A as a superset of A' that has a small representation size in the data structure but does not contain any of the candidates; and (i) computing the modified estimate of $D_i$ as the intersection of a previous estimate of $D_i$ and A.

11. The method according to claim 10, wherein the data structure comprises a binary decision diagram (BDD).

12. The method according to claim 6, wherein choosing the candidates comprises finding a first state in the intersection of $D_i$ and the first set, and adding to the candidates further states from the intersection which are found to have a large measure of difference relative to the first state.

13. Apparatus for finding a counterexample on a system of states, including one or more initial states and one or more bad states, and a transition relation among the states, the apparatus comprising a verification processor arranged to assemble a first set of the states known to be reachable from the initial states in accordance with the transition relation, to define a second set of the states from which it is estimated that one of the bad states is reachable in accordance with the transition relation, to modify the sets of the states until a definition of the second set is found such that from one or more of the states in an intersection of the first and second sets, there is at least one of the bad states that can be reached in a given number of steps of the transition relation, and to search for the counterexample over the states in the intersection.

14. The apparatus according to claim 13, wherein the processor is arranged to iteratively modify the first and second sets in accordance with the transition relation until the intersection is found.

15. The apparatus according to claim 13, wherein the verification processor assembles the first set of the states and defines the second set of the states by representing the states as implicitly conjoined binary decision diagrams (BDDs) of boolean variables that define the states.

16. The apparatus according to claim 13, wherein the system comprises a model of an electronic device, and wherein the states represent states assumed by the device in operation, and wherein the counterexample is indicative of a deviation of the model from a specification of the device.

17. The apparatus according to claim 13, wherein the transition relation comprises a transition function, and the system comprises a finite state machine.

18. Apparatus for finding a counterexample on a system of states, including one or more initial states and one or more bad states, and a transition relation among the states, the apparatus comprising a verification processor arranged to assemble a first set of the states known to be reachable from the initial states in accordance with the transition relation, to define a second set of the states from which it is estimated that one of the bad states is reachable in accordance with the transition relation, to modify the sets of the states until a definition of the second set is found such that from one or more of the states in an intersection of the first and second sets, there is at least one of the bad states that can be reached in a given number of steps of the transition relation, and to search for the counterexample over the states in the intersection, wherein the processor is arranged to iteratively modify the first and second sets in accordance with the transition relation until the intersection is found, and wherein the verification processor defines the second set of states by defining n+1 sets of the states, referred to as $D_0$ through $D_n$, wherein $D_0$ comprises the bad states, such that for each value of an index i, which assumes values from 1 to n, the verification processor estimates that one of the bad states can be reached in i steps of the transition relation from at least one of the states in $D_i$, and wherein the verification processor modifies the second set by choosing as candidates a subset of the states from the intersection of $D_i$ and the first set, by verifying that at least one of the candidates can reach one of the states in $D_{i-1}$ in one step of the transition relation, by refining the estimate of $D_i$ when none of the candidates can reach in one step any of the states in $D_{i-1}$, and by repeating such steps until one of the candidates is verified to reach one of the states in $D_{i-1}$ in one step of the transition relation.

19. The apparatus according to claim 18, wherein the verification processor modifies the second set by decrementing i, beginning from an initial value of n, and repeating such steps until one of the candidates is verified to reach one of the bad states in one step of the transition relation.

20. The apparatus according to claim 19, wherein the verification processor refines the estimate of $D_i$ by modifying the estimate of $D_i$ so that $D_i$ no longer includes the candidates, but still includes all the states from which the states of $D_{i-1}$ can be reached in one step of the transition relation.

21. The apparatus according to claim 20, wherein the verification processor modifies the estimate of $D_i$ by producing a set $D'_{i-1}$ as a superset of $D_{i-1}$ which has a small representation size in a data structure used to represent the states, computing a set A' to approximate a set of the states from which the states in $D'_{i-1}$ can be reached in one step of the transition relation, increasing a precision of the approximation for A' until A' does not contain any of the candidates, producing a set A as a superset of A' that has a small representation size in the data structure but does not contain any of the candidates, and by computing the modified estimate of $D_i$ as the intersection of a previous estimate of $D_i$ and A.

22. The apparatus according to claim 21, wherein the data structure comprises a binary decision diagram (BDD).

23. The apparatus according to claim 18, wherein the verification processor searches for the counterexample by performing a search over the first set of states.

24. The apparatus according to claim 23, wherein the verification processor performs the search by performing a breadth first search over the first set of states.

25. The apparatus according to claim 18, wherein the verification processor chooses the candidates by finding a first state in the intersection of $D_i$ and the first set, and adding to the candidates further states from the intersection which are found to have a large measure of difference relative to the first state.

26. A computer software product for finding a counterexample on a system of states, including one or more initialstates and one or more bad states, and a transition relation among the states, the product comprising a computer-readable medium in which program instructions are stored, which instructions, when read by a computer, cause the computer to assemble a first set of the states known to be reachable from the initial states in accordance with the transition relation, to define a second set of the states from which it is estimated that one of the bad states is reachable in accordance with the transition relation, to modify the sets of the states until a definition of the second set is found such that from one or more of the states in an intersection of the first and second sets, there is at least one of the bad states that can be reached in a given number of steps of the transition relation, and to search for the counterexample over the states in the intersection.

* * * * *